(12) United States Patent
Barrett, Jr. et al.

(10) Patent No.: US 6,573,782 B2
(45) Date of Patent: Jun. 3, 2003

(54) SIGMA DELTA FM RATIO DETECTOR

(75) Inventors: Raymond Louis Barrett, Jr., Ft. Lauderdale, FL (US); Barry Herold, Barrington, IL (US); Scott Humphreys, Greensboro, NC (US)

(73) Assignee: Motorola, Inc., Schaumburg, IL (US)

(*) Notice: Subject to any disclaimer, the term of this patent is extended or adjusted under 35 U.S.C. 154(b) by 91 days.

(21) Appl. No.: 09/769,941

(22) Filed: Jan. 26, 2001

(65) Prior Publication Data

US 2002/0101281 A1 Aug. 1, 2002

(51) Int. Cl.⁷ .................................................. H03D 3/02

(52) U.S. Cl. .................. 329/315; 329/336; 329/327; 329/318; 329/340; 455/214; 455/337; 455/334

(58) Field of Search ................................. 329/336, 315, 329/318, 320, 327, 340, 343; 455/214, 334, 337

(56) References Cited

U.S. PATENT DOCUMENTS 5,003,621 A * 3/1991 Gailus ........................ 455/209

* cited by examiner

*Primary Examiner*—Arnold Kinkead
(74) *Attorney, Agent, or Firm*—Randi L. Dulaney

(57) ABSTRACT

A circuit (100) for generating a ratio signal indicating a ratio of frequency error to signal magnitude of an input signal includes an FM ratio detector (110) and a sigma-delta analog-to-digital converter (130). The FM ratio detector (110) is responsive to the input signal and generates a magnitude signal and an error signal. The magnitude signal is representative of a magnitude of the input signal and the error signal is representative of a frequency error of the input signal relative to a preselected frequency. The sigma-delta analog-to-digital converter (130), which is responsive to the filtered magnitude signal and the filtered error signal, generates a stream of logic "1's" and logic "0's" that are indicative of a ratio of the filtered error signal to the filtered magnitude signal. Thus, the sigma-delta analog-to-digital converter generates the ratio signal (132).

14 Claims, 2 Drawing Sheets

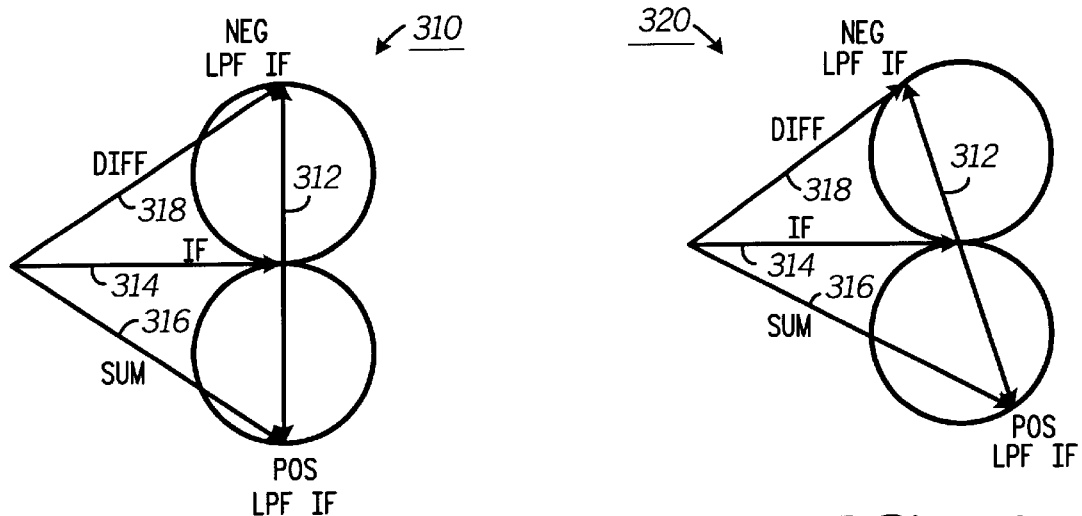
*FIG. 3*
*FIG. 4*
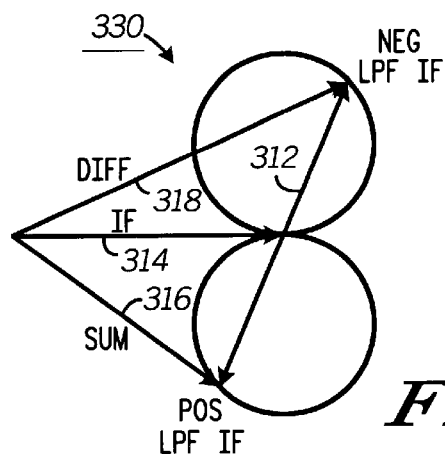
*FIG. 5*
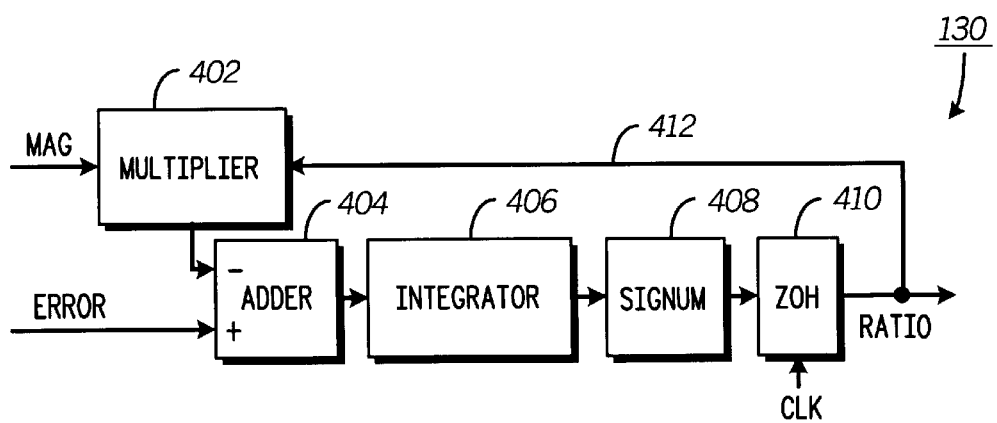
*FIG. 6*

SIGMA DELTA FM RATIO DETECTOR

BACKGROUND OF THE INVENTION

1. Field of the Invention

The present invention relates to communications systems and, more specifically, to a FM ratio detector.

2. Description of the Prior Art

In communication systems that employ frequency modulation (FM), an information signal is modulated onto a carrier wave to generate an FM signal having a frequency that varies about a carrier frequency. To demodulate an FM signal, a receiver must remove the carrier signal from the received signal, thereby leaving the information signal. To do this, the receiver must be able to determine the carrier frequency of the received signal. However, because of various transmission effects, a received FM signal may exhibit a carrier frequency that deviates from an ideal carrier frequency. Therefore, FM receivers employ a circuit that detects deviation between the received carrier signal and the expected carrier signal and that makes corresponding adjustments to the operating parameters of the demodulation circuit.

Existing digital implementations of frequency deviation (error) detectors lack the speed and precision required for certain applications of communications systems employing intermediate frequency (IF) signals. Therefore, there is a need for an FM ratio detector that has sufficient speed and precision for use in IF communications.

BRIEF DESCRIPTION OF THE FIGURES OF THE DRAWINGS

FIG. 3 is a phasor diagram relative to the FM ratio detector showing a first scenario.

FIG. 4 is a phasor diagram relative to the FM ratio detector showing a second scenario.

FIG. 5 is a phasor diagram relative to the FM ratio detector showing a third scenario.

FIG. 6 is a schematic diagram of one embodiment of a sigma-delta analog-to-digital converter employed in the present invention.

DETAILED DESCRIPTION OF THE INVENTION

Figure 1:
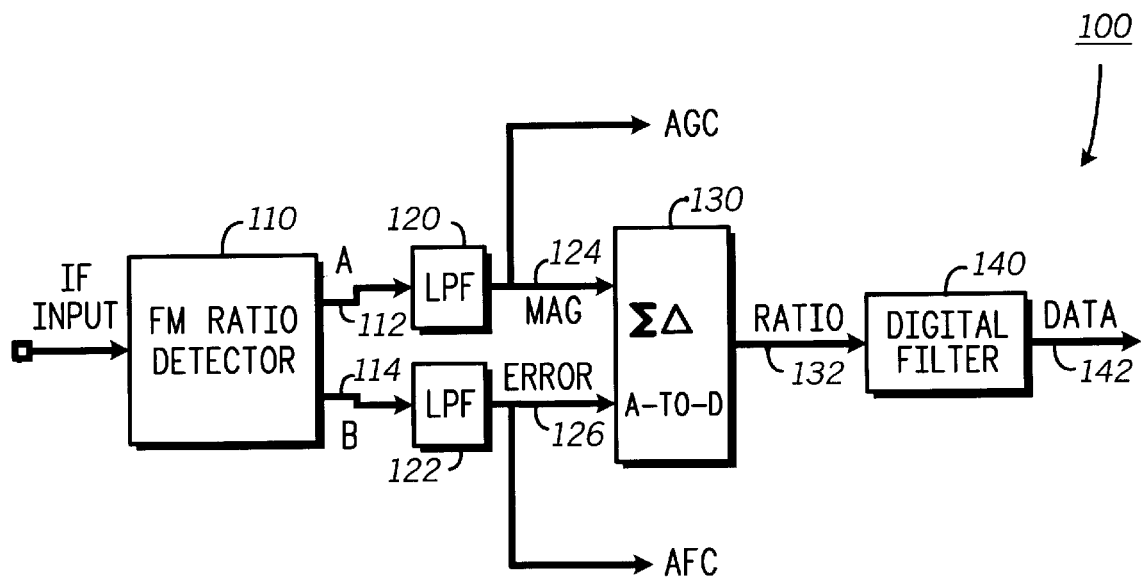
FIG. 1 is a schematic diagram of one embodiment of the present invention.

A preferred embodiment of the present invention is now described in detail. As shown in FIG. 1, one embodiment of the present invention is a circuit 100 for generating a ratio signal indicating a ratio of frequency error to signal magnitude of an input IF (intermediate frequency) signal. The circuit 100 includes an FM ratio detector 110 a first low-pass filter 120, a second low-pass filter 122 a sigma-delta analog-to-digital (A-to-D) converter 130 and a digital filter 140, which transforms the ratio signal into an output data signal 142 usable by a communications device.

The FM ratio detector 110 is responsive to the input signal and generates a magnitude signal 112 and an error signal 114. The magnitude signal 112 corresponds to the magnitude of the input signal and the error signal 114 corresponds to the magnitude of the frequency error of the input signal relative to the expected value of the carrier frequency.

Figure 2:
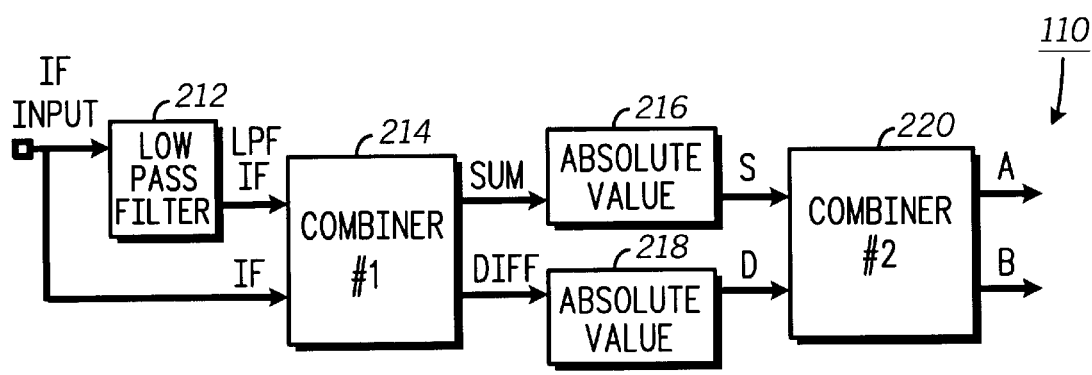
FIG. 2 is a schematic diagram of one embodiment of an FM ratio detector employed in the present invention.

As shown in FIG. 2, the FM ratio detector 210 includes a low pass filter 212 that generates a filtered input (LPF IF) signal that is nominally 90 degrees out of phase with the IF input (IF) signal. The phase shift of the LPF IF signal is 90 degrees when the input IF signal is at the corner frequency of the low pass filter 212, but has a different value when the input IF signal is not at the corner frequency of the low pass filter 212. A first combiner 214 generates a sum signal (SUM), corresponding to a vector sum of the input signal and the filtered input signal. The first combiner 214 also generates a difference signal (DIFF), corresponding to a difference of the input signal and the filtered input signal. Typically, the first combiner 214 includes a vector adder and a vector subtractor. A first absolute value circuit 216 generates an absolute value sum signal (S) and a second absolute value circuit 218 generates an absolute value difference signal (D). A second combiner 220 generates the magnitude signal (A), which equals the S signal plus the D signal. The second combiner 220 also generates the error signal (B), which equals the S signal minus the D signal.

Phasor diagrams demonstrating the vector relationships between the various signals for several scenarios are shown in FIGS. 3–5, in view of FIGS. 1 and 2. As shown in FIG. 3, phasor diagram 310 shows a scenario in which the LPF IF filtered signal 312 is 90 degrees out of phase with the unfiltered IF signal 314, indicating that the IF input signal 312 is at the corner frequency of the low pass filter 212. In this case, the DIFF signal 318 has a magnitude equal to the magnitude of the SUM signal 316. The SUM signal 316 and the DIFF signal 318 are full-wave rectified by the absolute value operations (216 and 218, respectively) to provide the corresponding signals S and D, which have a baseband component proportional to the magnitude of the phasors, as well as harmonics at twice the IF frequency and above due to the rectification process.

The second combiner 220 generates signal A which is the sum of S plus D and signal B which is the difference of signal S minus D. The SUM signal 316 is the phasor combination of the unfiltered IF signal 314 plus the LPF IF filtered signal 312 from the first combiner 214. The DIFF signal 318 is the phasor combination of the unfiltered IF signal 314 minus the LPF IF filtered signal 312 from the first Combiner 214. In this case, the absolute value operations 216 and 218 provide identical S and D baseband signals, but the harmonics produced by the rectification process differ in their phases relative to each other. The second combiner 220 provides signal B from the difference of S minus D, which is proportional to the frequency error of the IF input signal 314 from the corner frequency of the low pass filter 212.

As shown in FIG. 4, phasor diagram 320 demonstrates that when the unfiltered IF signal 314 is lower in frequency than the characteristic corner frequency of the low pass filter 212, the positive LPF IF filtered signal 312 is shifted less than 90 degrees, and displays a lower magnitude, resulting in a disparity in magnitudes of the SUM signal 316 (which is increased relative to the corner frequency of the low pass filter 212 and the DIFF signal 318 (which is decreased relative to the corner frequency of the low pass filter 212). Thus, the S base band component increases and the D base band component decreases. The result of this is that the A signal 112 remains relatively constant and the B signal 114 becomes negative.

As shown in FIG. 5, phasor diagram 330 demonstrates that for an IF Input signal 314 that is higher in frequency than the characteristic corner frequency of the low pass filter 212, LPF IF filtered signal 312 is shifted more than 90 degrees and displays a lowered magnitude off-corner frequency. This results in the SUM signal 316 being decreased relative to the corner frequency and the DIFF signal 318 being increased relative to the corner frequency. Thus, the S baseband component decreases and the D baseband component increases. The A signal 112 remains relatively constant and the B signal 114 becomes positive.

The magnitude of the B signal 114 is determined by the magnitude of the IF Input signal 314, as well as its difference from the characteristic corner frequency of the low pass filter 212. However, the ratio of the signal magnitudes of B/A is nearly independent of the magnitude of the IF Input signal.

Returning to FIG. 1, the first low pass filter 120 removes harmonics of the input signal from the magnitude signal 112 and that generates a filtered magnitude signal 124 that corresponds to an absolute value of the magnitude signal 112. Similarly, the second low pass filter 122 removes harmonics of the input signal from the error signal 114 and generates a filtered error signal 126 that corresponds to an absolute value of the error signal 114. The present invention has an added benefit in that the filtered magnitude signal 124 can be used for automatic gain control (AGC) functions and the filtered error signal 126 can be used for automatic frequency control (AFC) functions.

The sigma-delta analog-to-digital converter 130 generates a ratio signal 132, which is a stream of logic "1's" and logic "0's" that indicate a ratio of the filtered error signal 126 to the filtered magnitude signal 124. Referring to FIG. 4, the sigma-delta analog-to-digital converter 130 includes a multiplier 402 that multiplies the filtered magnitude signal by a feedback 412 from the ratio signal, thereby generating a multiplication signal. An adder 404 adds the multiplication signal to the error signal to generate an addition signal. An integrator 406 integrates the addition signal, thereby generating an two's compliment signed integration signal. A signum circuit 408 generates a signed ratio signal corresponding to the sign of the integration signal. The signed ratio signal is a "one" when the integration signal indicates a positive error to carrier ratio and is a "zero" when the integration signal indicates a negative error to carrier ratio. A zero-order-hold circuit 410 (such as a D flip-flop) outputs the zeros and ones from the signum circuit 408 so that they are clocked on a clock edge.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A circuit for generating a ratio signal indicating a ratio of frequency error to signal magnitude of an input signal, comprising:
   (a) an FM ratio detector, responsive to the input signal that generates a magnitude signal and an error signal, the magnitude signal being representative of a magnitude of the input signal and the error signal being representative of a frequency error of the input signal relative to a preselected frequency; and
   (b) a sigma-delta analog-to-digital converter, responsive to the magnitude signal and the error signal, that generates a stream of logic "1's" and logic "0's" that are indicative of a ratio of the magnitude signal to the error signal, thereby generating the ratio signal.

2. The circuit of claim 1, further comprising a digital filter, responsive to the ratio signal, that transforms the ratio signal into an output signal usable by a communications device.

3. The circuit of claim 1, wherein the input signal is an IF signal.

4. The circuit of claim 1, wherein the FM ratio detector comprises:
   (a) a low pass filter, responsive to the input signal, that generates a filtered input signal that is 90 degrees out of phase with the input signal;
   (b) a first combiner, responsive to both the input signal and the filtered input signal, that generates a sum signal, corresponding to a vector sum of the input signal and the filtered input signal, and that generates a difference signal, corresponding to a vector difference of the input signal and the filtered input signal;
   (c) a first absolute value circuit, responsive to the sum signal, that generates an absolute value sum signal;
   (d) a second absolute value circuit, responsive to the difference signal, that generates an absolute value difference signal; and
   (e) a second combiner, responsive to the absolute value sum signal and the absolute value difference signal, that generates the magnitude signal and the error signal.

5. The circuit of claim 4, wherein the first combiner comprises a vector adder and a vector subtractor.

6. The circuit of claim 1, wherein the sigma-delta analog-to-digital converter comprises:
   (a) a multiplier, that multiplies the magnitude signal by a feedback from the ratio signal, thereby generating a multiplication signal;
   (b) an adder that generates an addition signal corresponding to an addition of the multiplication signal and the error signal;
   (c) an integrator that generates an integration signal from the addition signal;
   (d) a signum circuit that generates a signed ratio signal corresponding to the integration signal; and
   (e) a zero-order-hold circuit that generates the ratio signal corresponding to the signed ratio signal so as to have state transitions clocked on a clock edge.

7. The circuit of claim 6, wherein the zero-order-hold circuit comprises a D flip-flop.

8. A circuit for generating a ratio signal indicating a ratio of frequency error to signal magnitude of an input signal, comprising:
   (a) an FM ratio detector, responsive to the input signal that generates a magnitude signal and an error signal, the magnitude signal being representative of a magnitude of the input signal and the error signal being representative of a frequency error of the input signal relative to a preselected frequency;
   (b) a first low pass filter, responsive to the magnitude signal, that removes harmonics of the input signal from the magnitude signal and that generates an absolute value of the magnitude signal, thereby generating a filtered magnitude signal;
   (c) a second low pass filter, responsive to the error signal, that removes harmonics of the input signal from the error signal and that generates an absolute value of the error signal, thereby generating a filtered error signal; and
   (d) a sigma-delta analog-to-digital converter, responsive to the filtered magnitude signal and the filtered error signal, that generates a stream of logic "1's" and logic "0's" that are indicative of a ratio of the filtered error signal to the filtered magnitude signal, thereby generating the ratio signal.

9. The circuit of claim 8, further comprising a digital filter, responsive to the ratio signal, that transforms the ratio signal into an output signal usable by a communications device.

10. The circuit of claim 8, wherein the input signal is an IF signal.

11. The circuit of claim 8, wherein the FM ratio detector comprises:

(a) a low pass filter, responsive to the input signal, that generates a filtered input signal that is 90 degrees out of phase with the input signal;

(b) a first combiner, responsive to both the input signal and the filtered input signal, that generates a sum signal, corresponding to a vector sum of the input signal and the filtered input signal, and that generates a difference signal, corresponding to a vector difference of the input signal and the filtered input signal;

(c) a first absolute value circuit, responsive to the sum signal, that generates an absolute value sum signal;

(d) a second absolute value circuit, responsive to the difference signal, that generates an absolute value difference signal; and (e) a second combiner, responsive to the absolute value sum signal and the absolute value difference signal, that generates the magnitude signal and the error signal.

12. The circuit of claim 11, wherein the first combiner comprises a vector adder and a vector subtractor.

13. The circuit of claim 8, wherein the sigma-delta analog-to-digital converter comprises:

(a) a multiplier, that multiplies the filtered magnitude signal by a feedback from the ratio signal, thereby generating a multiplication signal;

(b) an adder that generates an addition signal corresponding to an addition of the multiplication signal and the filtered error signal;

(c) an integrator that generates an integration signal from the addition signal;

(d) a signum circuit that generates a signed ratio signal corresponding to the integration signal; and (e) a zero-order-hold circuit that generates the ratio signal corresponding to the signed ratio signal so as to have state transitions clocked on a clock edge.

14. The circuit of claim 13, wherein the zero-order-hold circuit comprises a D flip-flop.

* * * * *